United States Patent [19]

Seesink et al.

[11] Patent Number: 5,442,319
[45] Date of Patent: Aug. 15, 1995

[54] ACTIVE BIASING CONTROL FOR CLASS-AB CMOS OPERATIONAL AMPLIFIERS

[75] Inventors: Petrus H. Seesink, Eindhoven; Reinder L. Post, Rosmalen, both of Netherlands

[73] Assignee: Sierra Semiconductor B.V., 'S-Hertogenbosch, Netherlands

[21] Appl. No.: 211,034

[22] PCT Filed: Sep. 3, 1992

[86] PCT No.: PCT/NL92/00151

§ 371 Date: Jun. 28, 1994

§ 102(e) Date: Jun. 28, 1994

[87] PCT Pub. No.: WO93/06655

PCT Pub. Date: Apr. 1, 1993

[30] Foreign Application Priority Data

Sep. 17, 1991 [NL] Netherlands ............ 9101567

[51] Int. Cl.[6] .................................. H03F 3/45
[52] U.S. Cl. ..................... 330/261; 330/253; 330/255
[58] Field of Search .............. 330/253, 255, 261

[56] References Cited

U.S. PATENT DOCUMENTS 5,047,665   9/1991   Burt .................. 330/253 X

FOREIGN PATENT DOCUMENTS 0123275  10/1984  European Pat. Off. .

OTHER PUBLICATIONS

Brehmer et al, "Large Swing CMOS Power Amplifier", *IEEE Journal of Solid-State Circuits*, vol. SC-18, No. 6, Dec. 1983 pp. 624-629.
Manninger, "ASICs für die Signalverarbeitung," *Electronik*, vol. 37, No.6, Mar. 1988, pp. 57, 58, 60-62.

*Primary Examiner*—James B. Mullins
*Attorney, Agent, or Firm*—Young & Thompson

[57] ABSTRACT

Biasing circuit for a class-AB Miller CMOS operational amplifier generating a first biasing voltage (VB1) for a MOS transistor (M5) determining the current through an operational amplifier input stage (M1...M5), as well as a second biasing voltage (VB1C) for a MOS-transistor (M8) determining the current in a source follower stage (M8, M9), among others comprising a series connection of a MOS transistor (MB1) connected as a diode and a current source (Iref), the junction point being connected to the inverting input of a biasing operational amplifier (A), the non-inverting input of which receives a signal from the junction point from a series connection of two MOS transistors (M8C, M9C) being proportional to the source follower stage (M8, M9). The output of the biasing operational amplifier (A) is connected to the gate electrode of MOS transistor (M8C). The inverting input also receives the first biasing voltage (VB1), whereas the output of the biasing operational amplifier provides the second biasing voltage (VB1C).

4 Claims, 2 Drawing Sheets

ACTIVE BIASING CONTROL FOR CLASS-AB CMOS OPERATIONAL AMPLIFIERS

The invention relates to a biasing circuit for a CMOS operational amplifier comprising at least an input operational amplifier, a source follower stage and an end stage, which input operational amplifier comprises a common stage having a first MOS transistor receiving a first biasing voltage from a biasing circuit, said source follower stage comprising at least a series connection of a second and a third MOS transistor, the gate electrode of the third MOS transistor receiving an output signal from the input operational amplifier and the gate electrode of the second transistor receives a second biasing voltage from the biasing circuit, said end stage comprising at least a series connections of a fourth and a fifth MOS transistor, the gate electrode of the fourth transistor being connected to the output of the source follower stage, said biasing circuit comprising at least a biasing operational amplifier having an inverting input and a non-inverting input, the inverting input being connected to a junction point of a series connection of a diode connected MOS transistor and a current source, the non-inverting input being connected to the output voltage of an inverting circuit comprising at least a series connection of a sixth MOS transistor and a seventh MOS transistor, the gate electrode of the sixth MOS transistor being connected to the output of the biasing operational amplifier, said output also supplying said second biasing voltage.

Such a biasing circuit is known from EP-A-0.123.275. The application of said known measures results in an operational amplifier in which the biasing currents are less dependent on variations of the power voltage. However, in the known circuit the first and second biasing voltages are generated by two independent biasing circuit parts (51, 60). No measures are taken or indicated to match the quiescent currents in both biasing circuit parts eventually resulting in matching problems between the biasing currents in the input operational amplifier and the source follower stage.

The object of the invention is to solve these matching problems from the known circuit in an easy and cost effective way.

Therefore, the biasing circuit defined above is characterized in that the gate electrode of the first MOS transistor receiving the first biasing voltage is directly connected to the junction point of the series connection of the diode connected MOS transistor and the current source. By applying these measures the biasing circuit only has one reference current, being the current defined by the current source, to which all other currents, inclusive of the currents in the CMOS operational amplifier, are related. All possible matching problems are thus solved. Moreover, less components in the biasing circuit are used, since no separate biasing circuit part to generate the first biasing voltage is needed any more, thus reducing costs.

In a further embodiment the biasing circuit according to the invention is characterized in that a first resistor is connected between said second MOS transistor and said third MOS transistor, and a second resistor is connected between said sixth MOS transistor and said seventh MOS transistor. The application of these measures further reduces the dependence on manufacturing variations and supply voltage variations.

In a preferred embodiment the voltage across said first resistor is equal to the voltage across said second resistor.

In a further preferred embodiment the first resistor and/or the second resistor are MOS transistors have a predetermined gate voltage. This results in increased slew rate, increased gain and increased capacitive driving capacity, because the gain of the source follower stage may be made larger than 1.

The invention will be explained hereinafter referring to the drawings in which

Figure 1:
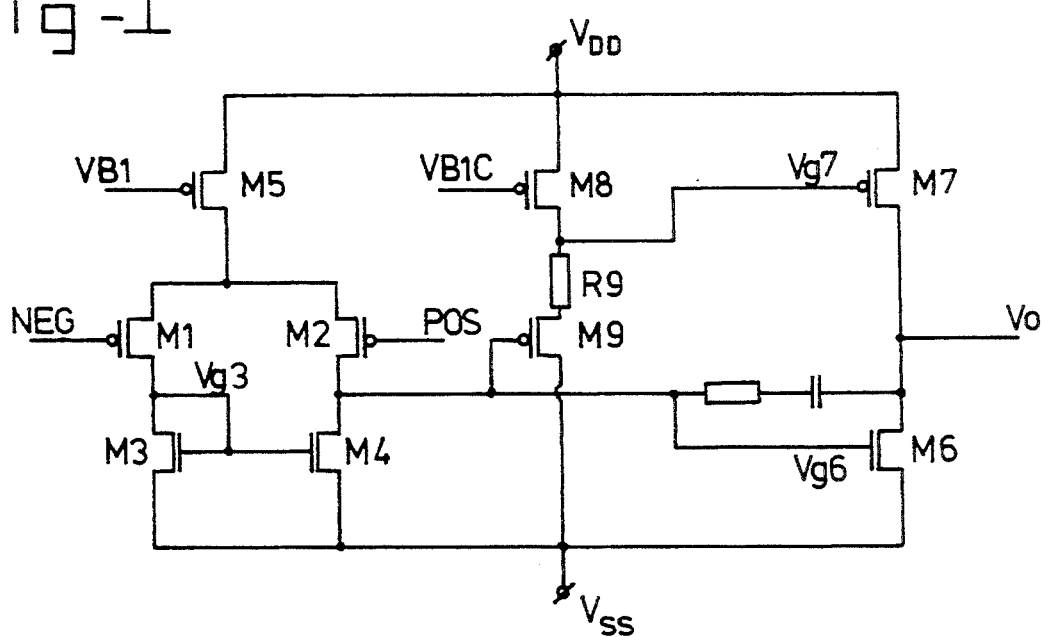
FIG. 1 shows a class-AB Miller operational amplifier.

FIG. 1 shows a class-AB Miller CMOS operational amplifier. Essentially, it comprises three stages: an input operational amplifier, comprising MOS transistors M1 to M5, a source follower stage, comprising PMOS transistors M8 and M9, and an end stage, consisting of the MOS transistors M6 and M7. Frequency compensation is provided by feedback of the output of the end stage through a series connection of a capacitor and a resistor, that may be substituted by a MOS transistor with constant gate voltage, to the input of the source follower stage. A resistor R9 may be connected between the MOS transistors M8 and M9 of the source follower stage, the purpose of resistor R9 being explained further below.

PMOS transistor M5 determines the biasing current in the input operational amplifier. The biasing current depends directly on the gate voltage VB1 of PMOS transistor MS. The current in the source follower stage is set by means of the gate voltage VB1C of transistor MS. Depending on the relation between the gate voltages VB1 and VB1C, and the relation between the dimensions of the MOS transistors M5 and M8 the biasing currents in the input operational amplifier and in the source follower stage will show a certain relation. In most cases is: VB1=VB1C.

If the inputs and the output of the CMOS operational amplifier in its not-active state have a voltage corresponding to the mid-supply voltage, the current through transistor M6 will be substantially equal to the current through transistor M7. This is of interest because then the CMOS operational amplifier will only have a random offset voltage, whereas the systematic offset voltage is as low as possible. The average offset voltage over a great number of CMOS operational amplifiers will therefore always be close to 0 Volt, independent of the manufacturing conditions of the chip comprising the CMOS operational amplifier, as well as of other conditions such as the magnitude of the supply voltage and the temperature.

Figure 2:
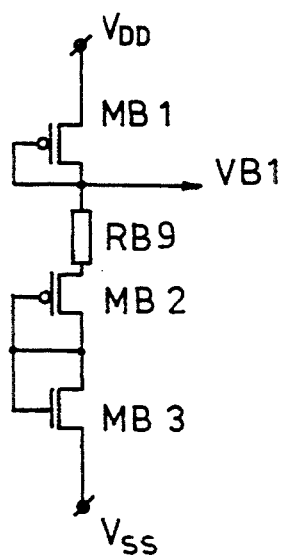
FIG. 2 shows a prior art biasing circuit.

These conditions may be met by the prior art biasing circuit of FIG. 2. FIG. 2 shows a biasing circuit comprising a series connection of a MOS-transistor MB1 connected as a diode, an optional resistor RB9, and two MOS transistors MB2 and MB3 connected as diodes. If VB1=VB1C the biasing circuit as shown may bias the CMOS operational amplifier in such a way that when it is not active the voltages at the inputs and the output correspond to the mid-supply voltage, provided that the following three conditions are met:

1. transistor M3 is substantially equal to transistor M4 and proportional to transistor MB3 from the biasing circuit;
2. transistor M9 is proportional to transistor MB2 from the biasing circuit and optional resistor RB9 is proportional to optional resistor RB9 from the biasing circuit;
3. transistor M8 is proportional to the transistors MB1 and M5.

It is noted that two MOS-transistors are proportional to each other if they:
1. are of the same type (NMOS or PMOS);
2. are substantially equal biased:
3. have substantially equal channel length;
4. have a substantially equal ratio $(w/L)/I_{am}$, in which W is the channel width, L is the channel length and $I_{ds}$ is the current through the MOS-transistor.

Furthermore, two resistors are proportional to each other, when they have the same voltage across their terminals for a given current.

To explain the conditions 1 to 3 mentioned above the following is to be noted. If transistor M3 is equal to transistor M4 and is proportional to transistor MB3, then the gate voltage of transistor M9 is equal to that of transistor MB2. When not active the output voltage of the input operational amplifier (at the point of connection of transistors M2 and M4) is equal to the gate voltage of transistor M3, in turn being equal to the gate voltage of transistor MB3. Furthermore, if also the conditions mentioned under points 2 and 3 are met, then the voltage between the drain and source electrode $V_{ds}$ ($=V_{gs}$) of transistor M8 is equal to that of transistor MB1 and transistors M9 and MB2 have equal voltages $V_{gs}$ between the gate- and source electrode. $V_{ds}$ of transistor M9 is not equal to that of transistor MB2. Eventually, this may be improved by a third transistor in the source follower stage. However, this is not strictly necessary, because the influence of the unequal drain-source voltages may be neglected.

Therefore, the gate voltage of transistor M7 is substantially equal to the biasing voltage VB1 provided by the biasing circuit. When not-active the current through transistor M7, therefore has a well defined relation to the current through transistors MB1 (and MS). Besides, when not-active the current through transistor M6 has a properly defined relation to the current through transistor M3 (and the currents through transistors MB3 and M4, because $V_{ds}$ of transistors MB3 and M4 is equal to that of transistor M3). Stated In other words: the biasing currents through transistors M6 and M7 have a predetermined relation to the currents in the biasing circuit, the input operational amplifier and the source follower stage.

If the CMOS operational amplifier of FIG. 1 is biased with the biasing circuit of FIG. 2, in which VB1=VB1C, the CMOS operational amplifier has a low systematic offset voltage, also showing little drift. However, a disadvantage of the biasing circuit according to FIG. 2 is that in practice the current flowing through the biasing circuit and therefore also through the different stages of the CMOS operational amplifier, strongly depend on the manufacturing conditions of the chip, and on other conditions, for instance the supply voltage and the temperature. Current variations of a factor of 10 may be possible in practice.

Figure 3:
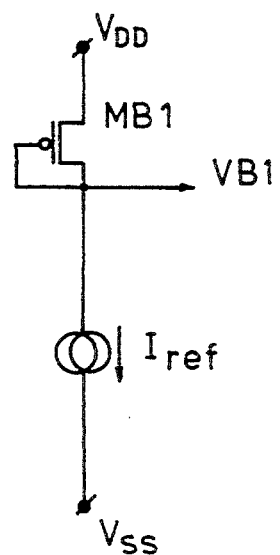
FIG. 3 shows another prior art biasing circuit.

FIG. 3 shows another biasing circuit, for instance known from U.S. Pat. No. 4,785,258, partly preventing the substantial current variations when biasing the CMOS operational amplifier. The biasing circuit as shown in FIG. 3 comprises a MOS transistor MB1 connected as a diode and connected in series with a current source $I_{ref}$. Therefore, the current in the biasing circuit is better defined than in the biasing circuit of FIG. 2. The current source $I_{ref}$ may be substituted by a resistor. Therefore, the current biasing in the input operational amplifier and the source follower stage of the CMOS operational amplifier, having a fixed ratio to the one in the biasing circuit, may be determined more accurately in advance.

However, the biasing circuit of FIG. 3 has other, important objections. This biasing circuit does not comprise a transistor MB3 being proportional to M3 and M4. Besides, no transistor MB2 is provided being proportional to transistor M9. Therefore, the gate voltage Vg7 of transistor M7 is not equal any more to the biasing voltage VB1. Vg7 strongly depends on the variations in the manufacturing process of the integrated circuit, the supply voltage and the temperature. If Vg7>VB1 then the current through the end stage may decrease to such a level that instability problems may arise. If Vg7<Vb1 then the current through the end stage may increase to an unacceptable level.

Figure 4:
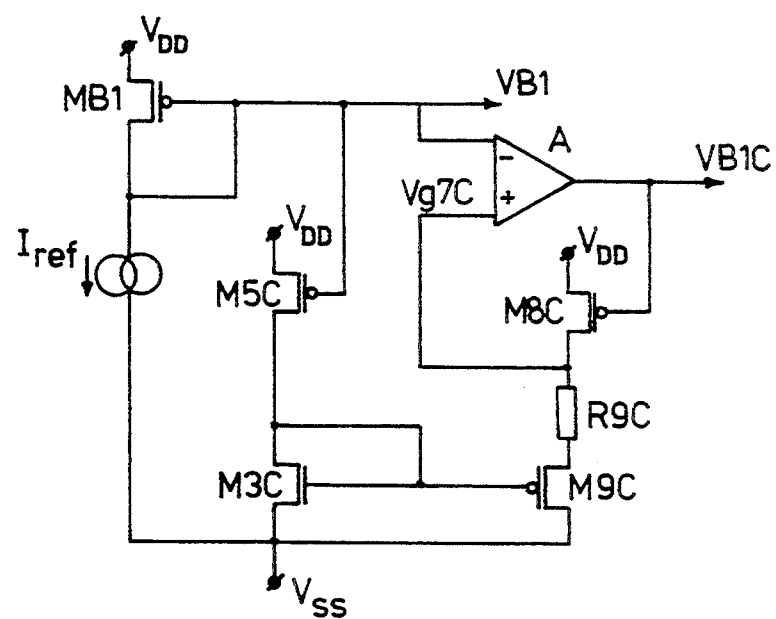
FIG. 4 shows a biasing circuit according to the invention.

The biasing circuit according to the invention, being shown in FIG. 4, solves the problems associated to the biasing circuits of FIGS. 2 and 3. The basic idea of the solution to the problems is, that the biasing circuit has to provide a biasing voltage to transistor M8 in the source follower stage which differs from the biasing voltage of transistor M5 in the common stage of the input operational amplifier, in such a way that when the amplifier is not-active, the gate voltage Vg7 of transistor M7 is equal to the biasing voltage VB1 as applied to transistor M5. Furthermore, if the current in the biasing circuit is properly defined, not only the gate voltage of transistor M7 is properly defined, but also the biasing currents in at least the input operational amplifier and the end stage are properly defined as well.

So, the biasing circuit is required to supply a first biasing voltage VB1 to transistor M5 and a second biasing voltage VB1C to transistor MS, in such a way that Vg7, when the amplifier is not-active, is substantially equal to the first biasing voltage VB1. FIG. 4 shows a preferred embodiment of the biasing circuit meeting this condition.

FIG. 4 shows a biasing circuit generating both biasing voltages VB1 and VB1C. Starting point was the prior art biasing circuit comprising a PMOS transistor MB1, connected as a diode and connected in series with a current source $I_{ref}$. Current source $I_{ref}$ may be substituted by a resistor without departing the scope of the present invention. The junction point of the PMOS transistor MB1 connected as a diode and the current source $I_{ref}$ provides the first biasing voltage VB1 for the gate electrode of MOS transistor M5 in the input operational amplifier of the CMOS operational amplifier. Said function point is also connected to the inverting input of biasing operational amplifier A, the output of which provides the second biasing voltage VB1C for the source follower stage. The output of the biasing operational amplifier A is fed back to its non-inverted input through an inverting circuit.

The inverting circuit comprises a series connection of a PMOS transistor MdC and a PMOS transistor M9C. In a preferred embodiment a resistor R9C may be applied between both PMOS transistors M8C and M9C.

The gate electrode of transistor M8C is connected to the output of the biasing operational amplifier A, whereas the drain electrode of transistor MdC is connected to the non-inverting input of the biasing operational amplifier A. The gate electrode of transistor M9C is connected to the gate electrode of an NMOS transistor M3C connected as a diode and connected in series with a PMOS transistor M5C. The gate electrode of transistor M5C receives biasing voltage VB1.

By choosing the proper dimensions of the different MOS transistors in the biasing circuit relative to the dimensions of the MOS transistors in the CMOS operational amplifier, the biasing current in especially the end stage (M6, M7) of the CMOS operational amplifier may be determined accurately and stably.

The condition therefore is that transistors M8C and M9C, respectively, are proportional to M8 and M9, respectively, whereas the optional resistor R9C has to be proportional to the optional resistor R9 in the source follower stage. The biasing operational amplifier A will cause the voltage Vg7C at its non-inverting input to be substantially equal to the voltage VB1 at its inverting input. Because of the proportionality between transistors M8C and M9, transistors M9C and M9, as well as between resistors R9C and R9, Vg7 will be substantially equal to Vg7C, and therefore to VB1. The exact current biasing of the source follower stage has become less important in this case. The influence of manufacturing variations and supply voltage variations have almost no influence any more on the biasing current of the end stage. Their main influence now is on the source follower stage, which in most cases is less objectionable.

Furthermore, for an appropriate dimensioning of the biasing circuit it is important that transistor M3C is proportional to transistor M3 and that the current through transistor M5C is equal to half the current through transistor M5 (the current through transistor M5 is split into two equal currents through transistors M3 and M4 in the input operational amplifier). Then, gate voltage Vg3C of transistor M3C is substantially equal to gate voltage Vg3 of transistor M3. When the amplifier is not-active, therefore, the gate voltage of transistor M9 will be substantially equal to the gate voltage of transistor M9C.

Resistors R9C and R9 may have a value of $\phi\Omega$. However, in a preferred embodiment they are given a predetermined non-zero value, because then the dependence on manufacturing variations and supply voltage variations is further reduced.

Both resistors may be substituted by a MOS transistor (MR), the gate electrode of which receives a predetermined voltage VBR. These MOS transistors substituting R9C and R9, then, have to be proportional to each other. An advantage of such an embodiment is that the gain factor of the source follower stage may then be larger than one. This results in further advantages of the CMOS operational amplifier, such as increased slew rate, increased gain and increased driving capacity.

Figure 5:
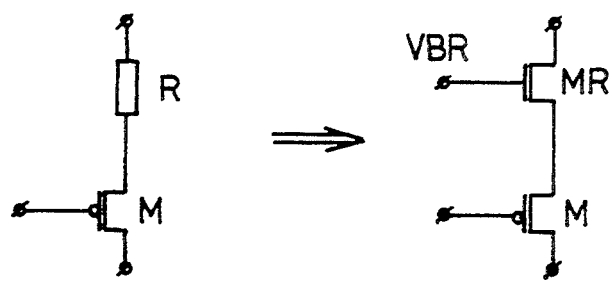
FIG. 5 shows an alternative to a part of the biasing circuit according to the invention.

To more fully explain this, the consequences of substituting resistor R9 by an NMOS transistor MR9 having a gate voltage VBR9 will now be described (compare FIG. 5). The input of the source follower stage is the gate of transistor M9 and the output voltage is the gate voltage Vg7. If the input voltage increases (Vg9 increasing), then the voltage at the source electrode of transistor M9, being connected to the source electrode of transistor MR9, increases with the same amount. Therefore the gate-source electrode-voltage (Vgs) of transistor MR9 decreases, so that the channel resistance of transistor MR9 increases. Because transistor M8 provides a fixed biasing current through the source follower stage the voltage across transistor MR9 increases extra. Therefore the gain of the source follower stage is larger than one.

It is to be noted that in the description and in the figures PMOS transistors may be substituted by NMOS transistors and visa versa by changing the signs of the power supply terminals accordingly.

We claim:

1. Biasing circuit for a CMOS operational amplifier comprising at least an input operational amplifier, a source follower stage and an end stage, which input operational amplifier comprises a common stage having a first MOS transistor (M5) receiving a first biasing voltage (VB1) from a biasing circuit, said source follower stage comprising at least a series connection of a second (M8) and a third (M9) MOS transistor, the gate electrode of the third MOS transistor (M9) receiving an output signal from the input operational amplifier and the gate electrode of the second transistor (M8) receives a second biasing voltage (VB1C) from the biasing circuit, said end stage comprising at least a series connections of a fourth (M7) and a fifth (M6) MOS transistor, the gate electrode of the fourth transistor (M7) being connected to the output of the source follower stage, said biasing circuit comprising at least a biasing operational amplifier (A) having an inverting input (−) and a non-inverting input (+), the inverting input (−) being connected to a junction point of a series connection of a diode connected MOS transistor (MB1) and a current source (Iref), the non-inverting input (+) being connected to the output voltage (Vg7C) of an inverting circuit comprising at least a series connection of a sixth MOS transistor (M8C) and a seventh MOS transistor (M9C), the gate electrode of the sixth MOS transistor (M8C) being connected to the output of the biasing operational amplifier (A), said output also supplying said second biasing voltage (VB1C), wherein the gate electrode of the first MOS transistor (M5) receiving the first biasing voltage (VB1) is directly connected to the junction point of the series connection of the diode connected MOS transistor (MB1) and the current source (Iref), and a first resistive means (R9) is connected between said second MOS transistor (MS) and said third MOS transistor (M9), and a second resistive means (R9C) is connected between said sixth MOS transistor (MSC) and said seventh MOS transistor (M9C).

2. Biasing circuit according to claim 1, wherein the voltage across said first resistive means (R9) is equal to the voltage across said second resistive means (R9C).

3. Biasing circuit according to claim 1, wherein at least one of said first resistive means (R9) and said second resistive means (R9C) is a MOS transistor (MR) having a predetermined gate voltage.

4. Biasing circuit according to claim 1, wherein at least one of said first resistive means (R9) and said second resistive means (R9C) is a resistor.

* * * * *